(12) United States Patent
Lee et al.

(10) Patent No.: US 7,005,908 B2
(45) Date of Patent: Feb. 28, 2006

(54) VOLTAGE LEVEL SHIFT CIRCUIT AND POWER SUPPLY DETECTION CIRCUIT

(75) Inventors: Yun-Woo Lee, Kwachon-chi (KR); Boo-Yung Huh, Suwon-shi (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/754,501

(22) Filed: Jan. 12, 2004

(65) Prior Publication Data

US 2004/0140842 A1  Jul. 22, 2004

(30) Foreign Application Priority Data

Jan. 13, 2003  (KR) ............... 10-2003-0002112

(51) Int. Cl.
*H03L 5/00* (2006.01)
(52) U.S. Cl. .................. 327/333; 326/68; 326/81
(58) Field of Classification Search ........... 327/333, 327/427, 68, 70, 72, 143, 198, 544; 326/68, 326/80, 81; 365/189.11
See application file for complete search history.

(56) References Cited

U.S. PATENT DOCUMENTS 6,020,761 A * 2/2000 Hwang et al. ............... 326/80
6,310,492 B1 * 10/2001 Ikoma et al. ................ 326/81
6,373,285 B1 * 4/2002 Konishi .......................... 326/81

FOREIGN PATENT DOCUMENTS

| JP | 5-315931 | * 11/1993 |
| KR | 2002-0007974 | 1/2002 |
| WO | WO 01/56158 A1 | 8/2001 |

OTHER PUBLICATIONS

Weste et al., Principles of CMOS VLSI Design: A Systems Perspective, Addison-Wesley Publishing Company, 1993, second edition, section 10.5.4, pp. 408-411.*

* cited by examiner

*Primary Examiner*—Long Nguyen
(74) *Attorney, Agent, or Firm*—Volentine Francos & Whitt, PLLC

(57) ABSTRACT

A first power supply node supplies a first voltage level during a normal operational mode, and a second power supply node supplies a second voltage level during the normal operational mode. An input circuit, which is connected to the first power supply node, receives an input signal and generates a corresponding signal having the first voltage level during the normal operational mode. An output circuit, which is connected to the second power supply node, receives the signal having the first voltage level and generates a corresponding output signal having the second voltage level during the normal operational mode. A detection circuit detects an interruption in the supply of the first voltage level by the first power supply node, and electrically blocks at least one leakage current path in the output circuit during the interruption.

8 Claims, 2 Drawing Sheets

VOLTAGE LEVEL SHIFT CIRCUIT AND POWER SUPPLY DETECTION CIRCUIT

BACKGROUND OF THE INVENTION

1. Field of the Invention

The present invention generally relates to semiconductor integrated circuits, and more particularly, the present invention relates to voltage level shift circuits used in semiconductor integrated circuits.

A claim of priority is made to Korean Patent Application No. 2003-2112, filed on Jan. 13, 2003, the contents of which are herein incorporated by reference in their entirety.

2. Description of the Related Art

Memory circuits and mixed integrated circuits are known which include embedded analog and digital circuits. Generally, the operating voltage of the analog circuits is greater than that of the digital circuits, and accordingly, a voltage level shift circuit is typically interposed as an interface between the analog and digital circuits.

FIG. 1 shows a conventional voltage level shift circuit. As shown, the voltage level shift circuit is generally comprised of an input part 110 and an output part 120. The input part 110 is supplied with a first power supply voltage VDD1 and a ground voltage VSS, and the output part 120 is supplied with a second power supply voltage VDD2 and the ground voltage VSS. The first power supply voltage VDD1 is lower than the second power supply voltage VDD2. For example, the first power supply voltage VDD1 may be 1.8 V and the second power supply voltage VDD2 may be 3.3 V. The input part 110 includes a first inverter 10 and a second inverter 20. The output part 120 includes PMOS transistors 31 and 32, NMOS transistors 33 and 34, and an inverter 40, which are connected as illustrated in FIG. 1.

When an input signal IN transitions from a logic low level of the ground voltage VSS to a logic high level of the first power supply voltage VDD1, an output node 15 of the inverter 10 goes low and an output node 25 of the inverter 20 becomes a logic high level of the first power supply voltage VDD1. As a result, the PMOS and NMOS transistors 32 and 33 of the output part 120 are turned on, the PMOS and NMOS transistors 31 and 34 are turned off, and an output signal Y of the inverter 40 becomes a logic high level of the second power supply voltage VDD2.

When the input signal IN transitions from a logic high level to a logic low level, the output node 15 of the inverter 10 has the first power supply voltage VDD1 and the output node 25 of the inverter 20 has the ground voltage VSS. As a result, the PMOS and NMOS transistors 32 and 33 of the output part 120 are turned off, the PMOS and NMOS transistors 31 and 34 are turned on, and the output signal Y of the inverter 40 becomes a logic low level of the ground voltage VSS.

In a normal operational mode, as set forth above, the voltage level shift circuit 100 receives an input signal IN of the first power supply voltage VDD1 to output an output signal Y of the second power supply voltage VDD2. However, a problem arises when the first power supply voltage VDD1 or the second power supply voltage VDD2 is interrupted in a power-down mode.

For example, in the case where the first power supply voltage VDD1 is interrupted to reduce power consumption, the output nodes 15 and 25 of the inverters 10 and 20 have indefinite voltage levels. If these indefinite voltages of output nodes 15 and 25 become a value of VSS+Vth (where Vth is the threshold voltage of an NMOS transistor), the NMOS transistors 33 and 34 in the output part 120 are turned on. This causes nodes 35 and 36 of the output part 120 to become low, which in turn causes the PMOS transistors 31 and 32 to be turned on. As a result, leakage current paths indicated by dotted lines in FIG. 1 are formed through the PMOS and NMOS transistors 31 and 33 and through the PMOS and NMOS transistors 32 and 34, respectively.

Furthermore, the voltage of the node 35 is divided by on-resistances of the turned-on transistors 31 and 33. A leakage current path can be created in the inverter 40 if the divided voltage of the node 35 reaches a trip (or switching) voltage of the inverter 40.

SUMMARY OF THE INVENTION

In accordance with one aspect of the present invention, a voltage level shift circuit is provided which includes a power detection circuit, and input circuit, and an output circuit. The power detection circuit generates a control signal in response to a first power supply voltage and a second power supply voltage. The input circuit, which is connected between the first power supply voltage and a ground voltage, receives an input signal and outputs at least one signal. The output circuit, which is connected between the second power supply voltage and the ground voltage, generates an output signal in response to the control signal and the at least one signal output from the input part.

In accordance with another aspect of the present invention, a power detecting circuit is provided which includes a first voltage divider, a second voltage divider, a comparator and an inverter. The first voltage divider, which is connected between a first power supply voltage and a ground voltage, outputs a signal according to a level of the first power supply voltage. The second voltage divider, which is connected between the second power supply voltage and the ground voltage, divides the second power supply voltage in response to the signal output from the first voltage divider. The comparator compares the signal output from the first voltage divider with an output of the second voltage divider, and the inverter receives an output of the comparator and outputs a control signal indicative of whether at least one of the first and second power supply voltages is interrupted.

In accordance with another aspect of the present invention, a voltage level shift circuit is provided which includes a first power supply node, a second power supply node, an input circuit, an output circuit, and a detection circuit. The first power supply node supplies a first voltage level during a normal operational mode, and the second power supply node supplies a second voltage level during the normal operational mode. The input circuit, which is connected to the first power supply node, receives an input signal and generates at least one corresponding signal having the first voltage level during the normal operational mode. The output circuit, which is connected to the second power supply node, receives the signal having the first voltage level and generates a corresponding output signal having the second voltage level during the normal operational mode. The detection circuit detects an interruption in the supply of the first voltage level by the first power supply node, and electrically blocks at least one leakage current path in the output circuit during the interruption.

BRIEF DESCRIPTION OF THE DRAWINGS

A more complete appreciation of the present invention, and many of the attendant advantages thereof, will become readily apparent as the same becomes better understood by reference to the following detailed description when considered in conduction with the accompanying drawings in which like reference symbols indicate the same or similar components, wherein.

DETAILED DESCRIPTION OF THE PREFERRED EMBODIMENTS

As examples only, an embodiment of the present invention will be described in the case where a first power supply voltage VDD1 is 1.8 V and a second power supply voltage VDD2 is 3.3 V.

Figure 2:
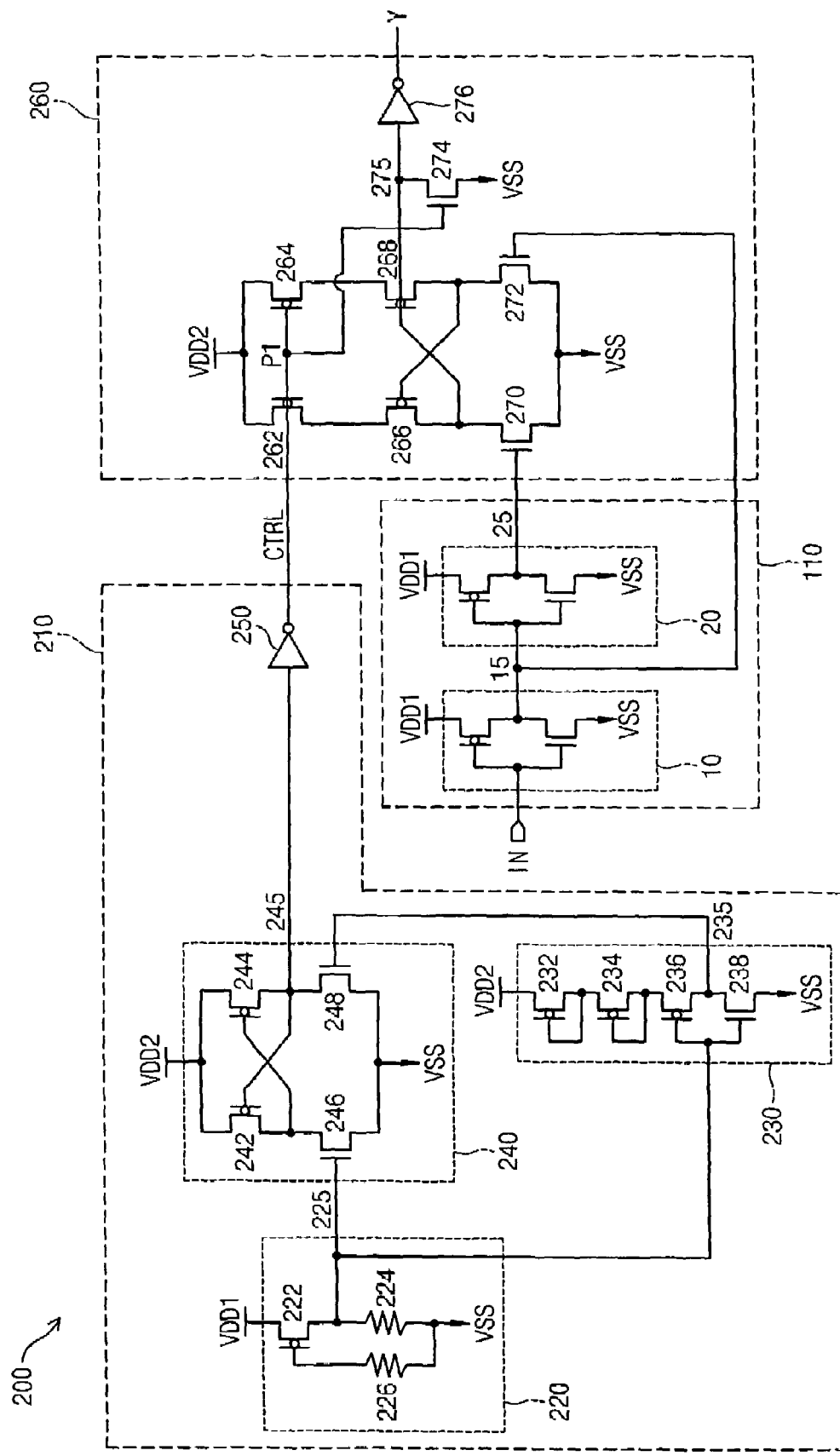
FIG. 2 is a circuit diagram of a voltage level shift circuit according to an embodiment of the present invention.

FIG. 2 shows a voltage level shift circuit according to an embodiment of the present invention. Referring to FIG. 2, the voltage level shift circuit 200 includes a power detector 210, an input part 110 and an output part 260. The power detector 210 is supplied with first and second power supply voltages VDD1 and VDD2 and generates a control signal CTRL. The input part 110 receives an input signal IN and sets voltage levels of nodes 15 and 25. The output part 260 generates an output signal Y in response to the control signal CTRL from the power detector 210 and signals from the nodes 15 and 25.

The power detector 210 includes a first divider 220, a second divider 230, a comparator 240, and an inverter 250. The first divider 220 is constituted of a PMOS transistor 222 and resistors 226 and 224. The gate of the PMOS transistor 222 is grounded via the resistor 226, and a current path of the PMOS transistor 222 is connected between the first power supply voltage VDD1 and a node 225. The resistor 224 is connected between the node 225 and a ground voltage VSS. Preferably, a value of the resistor 224 is considerably larger than that of the resistor 226. The second divider 230 includes PMOS transistors 232, 234 and 236 and an NMOS transistor 238. Current paths of the PMOS transistors 232, 234 and 236 are cascaded between the second power supply voltage VDD2 and a node 235, and a current path of the NMOS transistor 238 is formed between the node 235 and the ground voltage VSS. The gates of the transistors 236 and 238 are connected to receive an output of the first divider 220, and the gates of the PMOS transistors 232 and 234 are connected as diodes.

The comparator 240 includes PMOS transistors 242 and 244 and NMOS transistors 246 and 248. Current paths of the PMOS and NMOS transistors 242 and 246 are cascaded between the second power supply voltage VDD2 and the ground voltage VSS, and current paths of the PMOS and NMOS transistors 244 and 248 are cascaded between the second power supply voltage VDD2 and the ground voltage VSS. Gates of the transistors 246 and 248 are connected to receive output signals of the first and second dividers 220 and 230, respectively. The gate of the PMOS transistor 242 is connected to a node 245, and the gate of the PMOS transistor 244 is connected to the ground voltage VSS via the transistor 246. The inverter 250 is connected to the node 245 to output the control signal CTRL.

Figure 1:
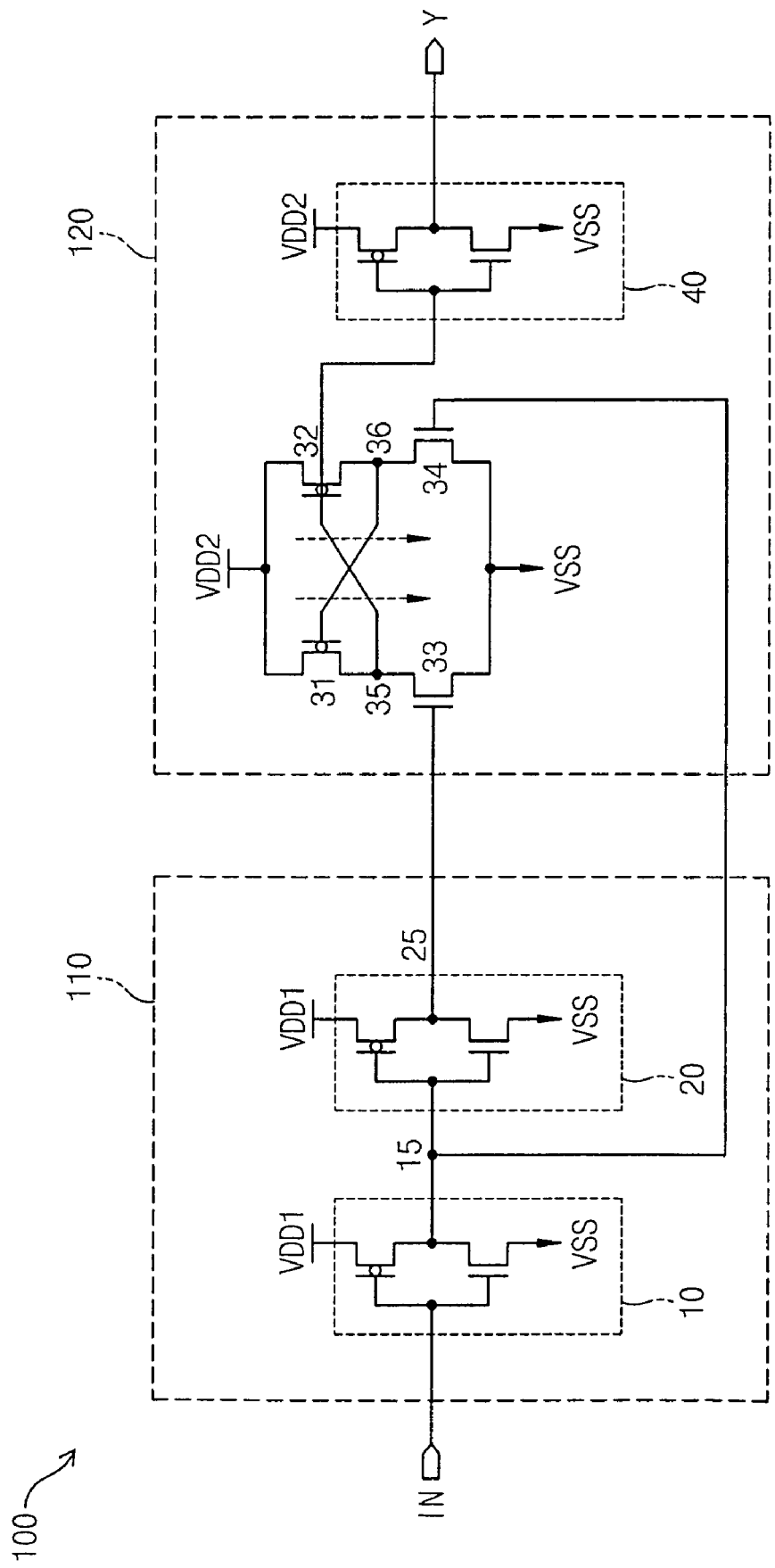
FIG. 1 is a circuit diagram of a conventional voltage level shift circuit.

The input part 110 is configured in the same manner as that shown in FIG. 1, and accordingly, constituent elements of the input part 110 shown in FIG. 2 are marked by the same numerals as used in FIG. 1, and a description thereof is thus omitted.

The output part 260 includes PMOS transistors 262, 264, 266 and 268, NMOS transistors 270, 272 and 274, and an inverter 276. The transistors 262, 266 and 270 have current paths cascaded between the second power supply voltage VDD2 and the ground voltage VSS. The transistors 264, 268 and 272 also have current paths cascaded between the second power supply voltage VDD2 and the ground voltage VSS. The gates of the transistors 262 and 264 are connected to receive the control signal CTRL from the power detector 210. The gates of the transistors 270 and 272 are connected to the nodes 15 and 25 in the input part 110, respectively. Gates of the transistors 266 and 268 are selectively grounded via the transistors 272 and 270, respectively. The NMOS transistor 274 is connected between a node 275 and a ground and is controlled by the control signal CTRL. The inverter 275 is connected to the node 275 to generate an output signal Y.

In a normal mode of operation, that is, when the first power supply voltage VDD1 of 1.8 V and the second power supply voltage VDD2 of 3.3 V are applied normally, an output node 225 of the first divider 220 goes high. Since the output node 225 is at a logic high level, an output node 235 of the second divider 230 goes low. The comparator 240 sets its output node 245 to a logic high level in response to the respective high level and low level output signals of the first and second dividers 220 and 230. Thus the power detector 210 generates the control signal CTRL of a logic low level.

This makes the PMOS transistors 262 and 264 turn on and the NMOS transistor 274 turn off. The second power supplied voltage is applied to the PMOS transistors 266 and 268, and the node 275 is not grounded at VSS. In this state, the output part 260 operates in a normal mode which is the same as that of the output part 120 described previously in connection with FIG. 1. For example, when an input signal IN of a logic high level is applied to the input part 110, the output nodes 15 and 25 of the inverters 10 and 20 become low and high levels, respectively. This makes the NMOS transistor 270 turn on and the NMOS transistor 272 turn on. Accordingly, during the normal mode of operation where the first and second power supply voltages VDD1 and VVD2 are applied normally, the voltage level shift circuit 200 receives the input signal IN having the first power supply voltage VDD1 and shifts the voltage thereof to the second power supply voltage VDD2.

In case of a power-down mode of operation where the first power supply voltage VDD1 is not applied, an output signal of the first divider 220 at node 225 becomes low. This low signal is applied to the input of the second divider 230, which is driven by the second power supply voltage VDD2, and the output signal of the second divider 230 at node 235 becomes high. In the comparator 240, the NMOS transistor 246 is turned off, and the NMOS transistor 248 is turned on. As a result, the output node 245 of the comparator 240 goes low, and the control signal CTRL from the inverter 250 goes to a high level. The high level of the control signal CTRL causes the PMOS transistors 262 and 264 to be turned off so as to electrically isolate the second power supply voltage VDD2, and the NMOS transistor 274 to be turned on to electrically ground the input to the inverter 276. As a result, even if the PMOS transistors 266 and 268 and NMOS transistors 270 and 272 all become conductive during the power-down mode, no leakage current paths are formed in the output part 260.

That is, according to the present invention, leakage current paths in the output circuit are made to be electrically blocked (opened) in response to an interruption in the supply of the first power supply voltage. In addition, during the interruption, the input to the inverter of the output circuit is grounded to prevent leakage via the inverter.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A voltage level shift circuit comprising:
   a power detector circuit which generates a control signal in response to a first power supply voltage and a second power supply voltage;
   an input circuit, connected between the first power supply voltage and a ground voltage, which receives an input signal and outputs a first signal; and,
   an output circuit, connected between the second power supply voltage and the ground voltage, which generates an output signal in response to the control signal and the first signal output from the input circuit;
   wherein the power detector comprises:
   a first voltage divider, connected between the first power supply voltage and the ground voltage, which outputs a signal in accordance with the first power supply voltage;
   a second voltage divider, connected between the second power supply voltage and the ground voltage, which divides the second power supply voltage in response to the signal output from the first voltage divider;
   a comparator which compares the signal output from the first voltage divider with an output of the second voltage divider; and
   an inverter which receives an output of the comparator and which outputs the control signal.

2. The circuit according to claim 1, wherein the first voltage divider comprises:
   a PMOS transistor having a source connected to the first power supply voltage, a drain and a gate;
   a first resistor having one end connected to the ground voltage and the other end connected to the drain of the PMOS transistor as an output of the first voltage divider; and
   a second resistor having one end connected to the ground voltage and the other end connected to the gate of the PMOS transistor.

3. The circuit according to claim 1, wherein the second voltage divider comprises:
   a first PMOS transistor having a source connected to the second power supply voltage, a drain and a gate, the drain and the gate of the first PMOS transistor being connected to each other;
   a second PMOS transistor having a source connected to the drain of the first PMOS transistor, a drain and a gate, the drain and the gate of the second PMOS transistor being connected to each other;
   a third PMOS transistor having a source connected to the drain of the second PMOS transistor, a gate connected to receive the signal output from the first voltage divider, and a drain; and
   an NMOS transistor having a drain connected to the drain of the third PMOS transistor, a source connected to the ground voltage and a gate connected to receive the output of the first voltage divider.

4. The circuit according to claim 1, wherein the comparator comprises:
   a first PMOS transistor having a source connected to the second power supply voltage, a drain and a gate;
   a second PMOS transistor having a source connected to the second power supply voltage, a drain and a gate;
   a first NMOS transistor having a drain connected to the drain of the first PMOS transistor and the gate of the second PMOS transistor, a gate connected to receive the signal output from the first voltage divider, and a source connected to the ground voltage; and
   a second NMOS transistor having a drain connected to the drain of the second PMOS transistor and the gate of the first PMOS transistor, a gate connected to receive the output of the second voltage divider, and a source connected to the ground voltage.

5. The circuit according to claim 1, wherein the input circuit comprises:
   a first inverter which receives the input signal; and
   a second inverter which receives an output of the first inverter.

6. The circuit according to claim 5, wherein the output of the first inverter is the first signal;
   wherein the input circuit further outputs a second signal from the second inverter; and,
   wherein the output circuit comprises:
   a first PMOS transistor having a source connected to the second power supply voltage, a gate connected to receive the control signal, and a drain;
   a second PMOS transistor having a source connected to the second power supply voltage, a gate connected to receive the control signal, and a drain;
   a third PMOS transistor having a source connected to the drain of the first PMOS transistor, a drain and a gate;
   a fourth PMOS transistor having a source connected to the drain of the second PMOS transistor, a drain and a gate;
   a first NMOS transistor having a drain connected to the drain of the third PMOS transistor and the gate of the fourth PMOS transistor, a gate connected to receive the second signal output from the input circuit, and a source connected to the ground voltage;
   a second NMOS transistor having a drain connected to the drain of the fourth PMOS transistor and the gate of the third PMOS transistor, a gate connected to receive the first signal output from the input circuit, and a source connected to the ground voltage;
   a third NMOS transistor having a drain connected to the drain of the first NMOS transistor, a source connected to the ground voltage and a gate connected to receive the control signal; and
   an inverter having an input connected to the drains of the first and third NMOS transistors and an output connected to output the output signal.

7. A voltage level shift circuit comprising:
   a first power supply node which supplies a first voltage level during a normal operational mode;
   a second power supply node which supplies a second voltage level during the normal operational mode;
   an input circuit which is connected to the first power supply node and which receives an input signal and generates a corresponding first output signal having the first voltage level during the normal operational mode;
   an output circuit which is connected to the second power supply node and which receives the corresponding first output signal having the first voltage level and which generates a corresponding second output signal having the second voltage level during the normal operational mode; and
   a detection circuit for generating a control signal which detects an interruption in the supply of the first voltage level by the first power supply node, and which electrically blocks at least one leakage current path in the output circuit during the interruption;

wherein the output circuit comprises an inverter having an input that is grounded in response to the interruption detected by the detection circuit; and wherein the detection circuit comprises:

a first voltage divider, connected between the first power supply node and the ground which outputs a signal in accordance with the first voltage level;

a second voltage divider, connected between the second power supply node and the ground, which divides the second voltage level; in response to the signal output from the first voltage divider;

a comparator which compares the signal output from the first voltage divider with an output of the second voltage divider; and an inverter which receives an output of the comparator and which outputs the control signal.

8. The circuit according to claim 7, wherein the interruption occurs during a power-down operational mode.

* * * * *